United States Patent
Chu et al.

(10) Patent No.: US 10,355,048 B1
(45) Date of Patent: Jul. 16, 2019

(54) ISOLATION STRUCTURE OF SEMICONDUCTOR DEVICE AND METHOD FOR FABRICATING THE SAME

(71) Applicant: United Microelectronics Corp., Hsinchu (TW)

(72) Inventors: Chung-Liang Chu, Kaohsiung (TW); Yu-Ruei Chen, New Taipei (TW); Hung-Yueh Chen, Hsinchu (TW); Yu-Ping Wang, Taoyuan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/920,008

(22) Filed: Mar. 13, 2018

(30) Foreign Application Priority Data

Feb. 27, 2018 (CN) .......................... 2018 1 0161019

(51) Int. Cl.
| | |
|---|---|
| *H01L 27/22* | (2006.01) |
| *H01L 21/76* | (2006.01) |
| *H01L 29/78* | (2006.01) |
| *G11C 11/16* | (2006.01) |
| *H01L 29/06* | (2006.01) |
| *H01L 21/762* | (2006.01) |
| *H01L 43/12* | (2006.01) |
| *H01L 43/02* | (2006.01) |
| *H01L 21/3205* | (2006.01) |
| *H01F 10/32* | (2006.01) |
| *H01L 43/08* | (2006.01) |

(52) U.S. Cl.
CPC ...... *H01L 27/228* (2013.01); *H01L 21/32055* (2013.01); *H01L 21/76224* (2013.01); *H01L 29/0649* (2013.01); *H01L 29/7851* (2013.01); *H01L 43/02* (2013.01); *H01L 43/12* (2013.01); *G11C 11/161* (2013.01); *H01F 10/3254* (2013.01); *H01L 43/08* (2013.01)

(58) Field of Classification Search
CPC ............ H01L 27/228; H01L 21/32055; H01L 21/76224; H01L 29/0649; H01L 29/7851; H01L 43/02; H01L 43/12; H01L 43/08; G11C 11/161; H01F 10/3254
USPC .................................. 257/401; 438/284, 286
See application file for complete search history.

(56) References Cited

U.S. PATENT DOCUMENTS

| | | | |
|---|---|---|---|
| 6,845,036 B2 | 1/2005 | Witcraft et al. | |
| 9,608,062 B1 * | 3/2017 | Tseng | ................. H01L 29/0653 |
| 2015/0161316 A1 | 6/2015 | Mani | |
| 2016/0225818 A1 | 8/2016 | Toh et al. | |
| 2016/0276429 A1 * | 9/2016 | Tseng | ................. H01L 29/0649 |

* cited by examiner

Primary Examiner — Didarul A Mazumder
(74) Attorney, Agent, or Firm — J.C. Patents

(57) ABSTRACT

An isolation structure is disposed between fin field effect transistors of a magnetic random access memory (MRAM) device. The isolation structure includes a fin line substrate, having a trench crossing the fin line substrate. An oxide layer is disposed on the fin line substrate other than the trench. A liner layer is disposed on an indent surface of the trench. A nitride layer is disposed on the liner layer, partially filling the trench. An oxide residue is disposed on the nitride layer within the trench at a bottom portion of the trench. A gate-like structure is disposed on the oxide layer and also fully filling the trench.

20 Claims, 9 Drawing Sheets

ISOLATION STRUCTURE OF SEMICONDUCTOR DEVICE AND METHOD FOR FABRICATING THE SAME

CROSS-REFERENCE TO RELATED APPLICATION

This application claims the priority benefit of China application serial no. 201810161019.2, filed on Feb. 27, 2018. The entirety of the above-mentioned patent application is hereby incorporated by reference herein and made a part of this specification.

BACKGROUND

1. Field of the Invention

The present invention generally relates to semiconductor fabrication technology, and particularly to an isolation structure of a semiconductor device and the fabrication thereof.

2. Description of Related Art

As to the need to reduce the size of semiconductor device, a great development has been efforted on designing transistor.

Taking the magnetic random access memory (RAM) apparatus as an example, it includes a large number of control transistors. The transistor size would influence the capacity of the memory apparatus.

As to the development in design on transistor, the fin field effect transistor (FinFET) has been proposed, which can effectively reduce the transistor size and then is a good choice to form as a part of the RAM cell.

To a large number of memory cell, it usually takes a single cell or multiple cells as a cell unit and the isolation is necessary between the cell units. To an option that the FinFET is taken in the magnetic RAM (MRAM) cell, conventionally, a shallow trench isolation (STI) structure, crossing the fin structures, is usually used to isolate the cell unit. However, the size of the STI structure is still large. After accumulation in size of a large number of STI structures, the while memory apparatus would be accordingly large.

It is a concerning issue to reduce the whole size of the memory apparatus about how to reduce the size of the isolation structures between the cell units while the isolation effect can still remain.

SUMMARY OF THE INVENTION

In accordance with embodiments, the invention provides an isolation structure of a semiconductor device and the fabrication thereof, in which the size of the isolation structure between the cell units can be reduced and the isolation effect can still remain at least in acceptable level.

In an embodiment, the invention provides an isolation structure, disposed between fin field effect transistors of a magnetic random access memory (MRAM) device. The isolation structure includes a fin line substrate, having a trench crossing the fin line substrate. An oxide layer is disposed on the fin line substrate other than the trench. A liner layer is disposed on an indent surface of the trench. A nitride layer is disposed on the liner layer, partially filling the trench. An oxide residue is disposed on the nitride layer within the trench at a bottom portion of the trench. A gate-like structure is disposed on the oxide layer and also fully filling the trench.

In an embodiment for the isolation structure, it further comprises a spacer on a sidewall of the gate-like structure.

In an embodiment for the isolation structure, the gate-like structure comprises polysilicon.

In an embodiment for the isolation structure, the gate-like structure comprises a stack of high-K dielectric layer and metal layer.

In an embodiment for the isolation structure, the gate-like structure is a bar line, crossing over the fin line substrate.

In an embodiment for the isolation structure, a width of the gate-like structure is substantially equal to a width of a gate line for the fin field effect transistors.

In an embodiment for the isolation structure, the trench is disposed between adjacent two cell units, and each cell unit comprises single bit cell, two bit cells, or more cells.

In an embodiment, the invention provides an isolation structure, disposed between fin field effect transistors of a magnetic random access memory (MRAM) device. The isolation structure includes a fin line substrate, having a trench crossing the fin line substrate. An oxide layer is disposed on the fin line substrate other than the trench. A liner layer is disposed on an indent surface of the trench. A nitride layer is disposed on the liner layer, partially filling the trench. A gate-like structure is disposed on the oxide layer, wherein a portion of the gate-like structure on nitride layer to fully fill the trench.

In an embodiment for the isolation structure, it further comprises a spacer on a sidewall of the gate-like structure.

In an embodiment for the isolation structure, the gate-like structure comprises polysilicon.

In an embodiment for the isolation structure, the gate-like structure comprises a stack of high-K dielectric layer and metal layer.

In an embodiment for the isolation structure, the gate-like structure is a bar line, crossing over the fin line substrate.

In an embodiment for the isolation structure, a width of the gate-like structure is substantially equal to a width of a gate line for the fin field effect transistors.

In an embodiment for the isolation structure, wherein the trench is disposed between adjacent two cell units, and each cell unit comprises single bit cell, two bit cells or more cells.

In an embodiment, the invention provides a method for fabricating isolation structure, disposed between fin field effect transistors of a magnetic random access memory (MRAM) device. The method includes forming a trench in a fin line substrate. An oxide layer is formed on the fin line substrate other than the trench. A liner layer is formed on an indent surface of the trench. A nitride layer is formed on the liner layer, partially filling the trench. A gate-like structure is formed on the oxide layer and also fully filling the trench.

In an embodiment for the method, the trench is formed at same time for forming a trench of a shallow trench isolation structure of the MRAM device.

In an embodiment for the method, the trench is formed after forming a shallow trench isolation structure of the MRAM device.

In an embodiment for the method, the gate-like structure comprises polysilicon.

In an embodiment for the method, the gate-like structure comprises a stack of high-K dielectric layer and metal layer.

In an embodiment for the method, the gate-like structure is a bar line crossing over the fin line substrate, wherein a width of the gate-like structure is substantially equal to a width of a gate line for the fin field effect transistors.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The invention is directed to the isolation technology for the transistors in the MRAM cell.

A memory cell at least includes a magnetic tunnel junction (MTJ) memory layer and a control transistor. One terminal of the MTJ memory layer is connected to a drain electrode of the control transistor and another terminal is connected to the bit line. The gate electrode of the control transistor is connected to the word line and the source terminal is connected to selection line. An isolation is necessary between the control transistors.

Figure 1:
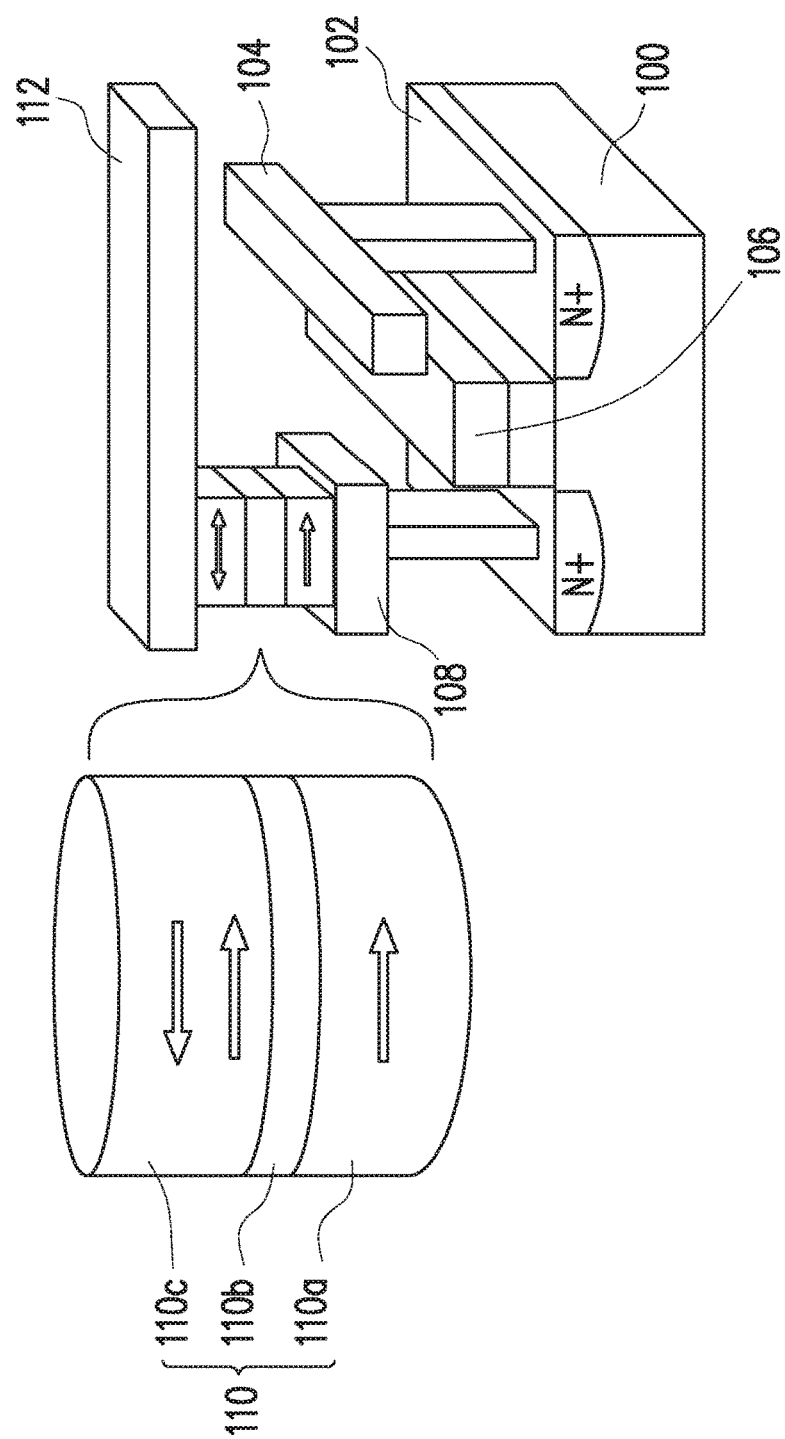
FIG. 1 is a drawing, schematically illustrating a cell structure of a magnetic random access memory apparatus, according to an embodiment of the invention.

FIG. 1 is a drawing, schematically illustrating a cell structure of a magnetic random access memory apparatus, according to an embodiment of the invention. Referring to FIG. 1, the basic structure for a MRAM cell includes the control transistor, which is formed on a substrate 100. The gate electrode 106 of the transistor is connected to the word line. A doped region 102 of the transistor, such as the source region, is connected to the selection line 104. Another doped region 102 of the transistor, such as the drains region, is connected to the memory structure 108. The memory structure 108 includes MTJ memory layer 110, under control by the bit line 112. The MTJ memory layer 110 include a pinned layer 110a, a barrier layer 110b, and a free layer 100c. The pinned layer 110a has the magnetization direction at a fixed direction. The magnetization direction of the free layer 110c can be freely and bidirectionally flipped according to the operation, so to form a parallel state or anti-parallel state with respect to the magnetization direction in the pinned layer and thereby have different magnetic resistances, such that data of one bit can be stored. The memory cell structure in FIG. 1 is just a basic example, the actual structure may have other design. The invention is not limited to the example.

As to the development in semiconductor fabrication, the control transistor can be fabricated by the fin FET in an example so to reduce the transistor size.

The invention takes the fin FET as a base to form a RAM cell, and proposes a single diffusion break (SDB) isolation structure for isolating between the control transistors. The isolation distance between the control transistors can be reduced, so to reduce the device area in use, and the isolation structure can still have sufficient isolation capability.

Multiple embodiments are provided to describe the invention, but the invention is not limited to the embodiments as provided.

Figure 2A:
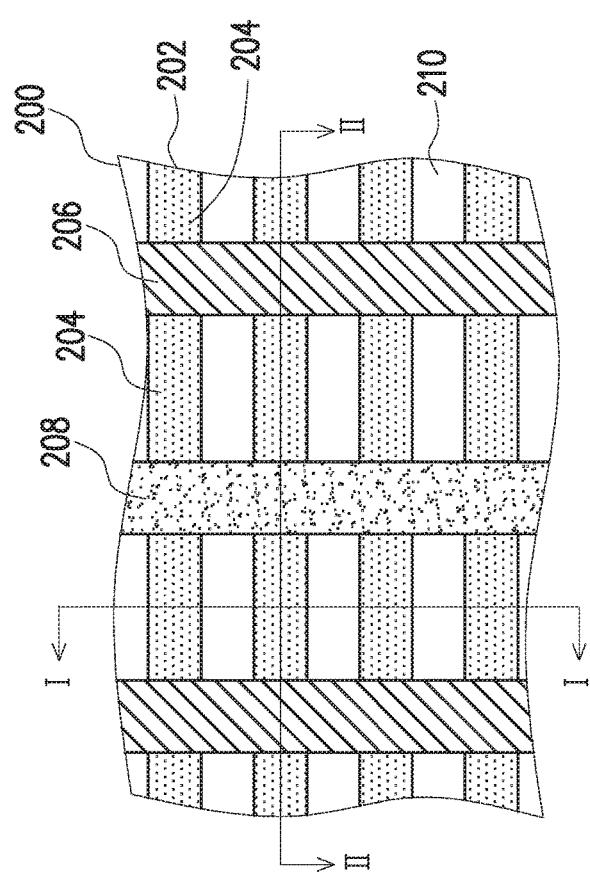
FIG. 2A is a drawing, schematically illustrating a top view structure of control transistor.
Figure 2B:
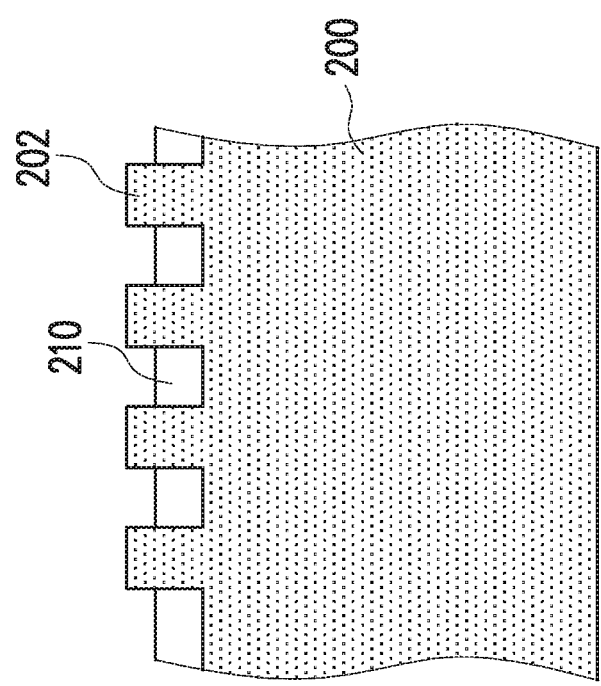
FIG. 2B is a drawing, schematically illustrating a cross-section structure along a cutting line I-I on the fin line substrate in FIG. 2A.

FIG. 2A is a drawing, schematically illustrating a top view structure of control transistor. FIG. 2B is a drawing, schematically illustrating a cross-section structure along a cutting line I-I on the fin line substrate in FIG. 2A. Referring to FIG. 2A and FIG. 2B, the control transistor is fabricated by fin FET. In this situation, the substrate 200, such as a silicon substrate, is firstly formed to have the protruding structure of fin line. The protruding structure of fin line is a top structure of the substrate 200, so a fin line substrate 202 is also referred to in the following description. A gate line 206 crosses over the fin line substrate 202, in which the source/drain (S/D) regions 204 are formed in the surface of the fin line substrate 202 and located at both sides of the gate line 206. A dielectric layer 210 is disposed between the fin line substrate 202.

The isolation structure 208 as proposed in invention disposed between the adjacent transistors has a width just about a line width of the gate line 206, so the width of the isolation structure 208 can be effectively reduced, such that the total area used by the whole integrated circuit can be reduced. The isolation structure 208 in detail and the fabrication method thereof are to be described later.

Figure 3:
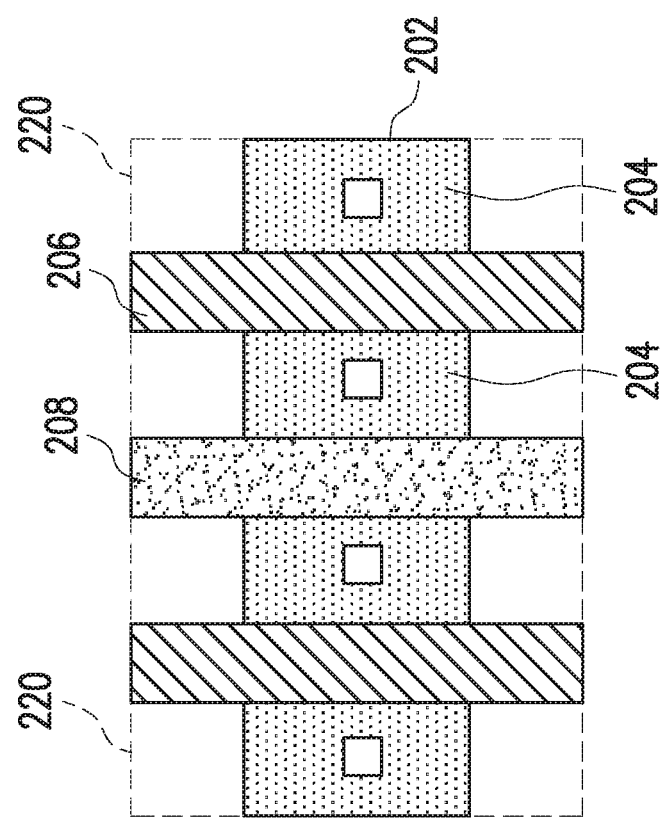
FIG. 3 is a drawing, schematically illustrating a top view structure of a MRAM, according to an embodiment of the invention.

FIG. 3 is a drawing, schematically illustrating a top view structure of a MRAM, according to an embodiment of the invention. Referring to FIG. 3, the isolation structure 208 of the invention can be fabricated by the process compatible with the process for fabricating the gate line 206, and have the effect for isolating the memory cell 220. In an embodiment, a cell unit 220 as an example can take a single transistor as one unit, which is isolated by the isolation structure 208.

Figure 4:
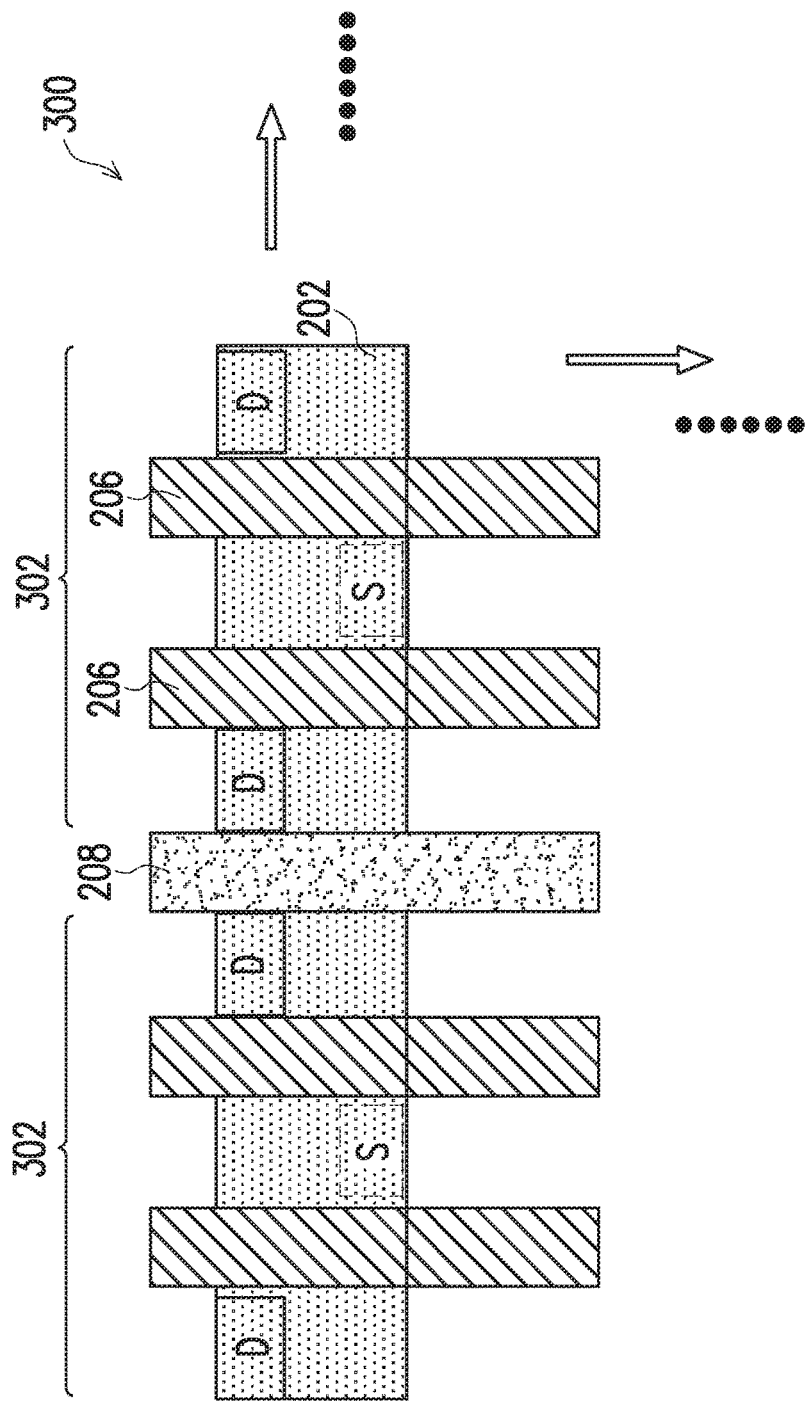
FIG. 4 is a drawing, schematically illustrating a top view structure of a MRAM, according to an embodiment of the invention.

In another embodiment, the cell unit 220 can also include multiple transistors as one cell unit. FIG. 4 is a drawing, schematically illustrating a top view structure of a MRAM, according to an embodiment of the invention. Referring to FIG. 4, a cell unit 302 includes two transistors as an example, in which the source region of the adjacent two transistors can be commonly used. A connection pad (S) can be used to connect to the selection line. The drain region of the transistors can be connected to the memory device through the connection pad (D). Actually, the number of the cell units are configured in accordance with the actual design in need, in which the isolation structures 208 provide the isolation effect.

FIG. 5A to FIG. 5F are drawings, schematically illustrating a portion of the cross-section structure along the cutting line II-II in FIG. 2A in a process flow of the method to fabricate the isolation structure, according to an embodiment of the invention.

Figure 5A:
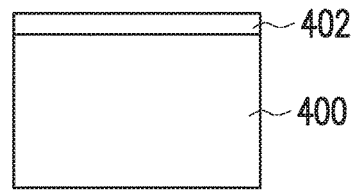
FIG. 5A to FIG. 5F are drawings, schematically illustrating a portion of the cross-section structure along the cutting line II-II in FIG. 2A in a process flow of the method to fabricate the isolation structure, according to an embodiment of the invention.

Referring to FIG. 5A, the fabrication process flow for forming the isolation structure 208 is described as follows. The structure as shown is the cross-section structure on the fin line substrate 400. It is formed in accordance with the STI process at the surrounding area. A pad oxide layer 402 is formed on the fin line substrate 400. The thickness of the pad oxide layer 402 can be 40 angstroms in an example, but not limited to this thickness.

Figure 5B:
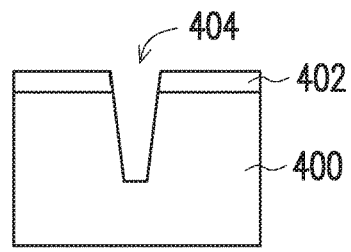

Referring to FIG. 5B, a trench 404 is formed in the fin line substrate 400, crossing over the fin line substrate 400. The location of the trench 404 is corresponding to the location where the isolation structure 208 is to be formed. The pad oxide layer 402 would be merged into another dielectric layer at the end structure, to form on the fin line substrate 400 at the region other than the trench 404, as the oxide layer 412 in FIG. 5F.

Figure 5C:
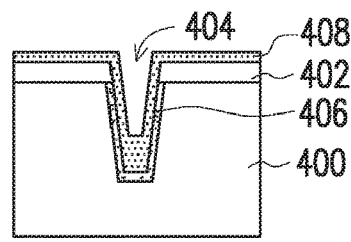

Referring to FIG. 5C, a liner layer 406 is formed on the indent surface of the trench 404. The liner layer 406 is an oxide layer formed by an oxidation process in an example on the exposed substrate surface. Then, the deposition process is used to form a nitride layer 408 over the liner layer 406 and the pad oxide layer 402. The thickness of the nitride layer 408 is small, so the nitride layer 408 is basically conformal to the sidewall and the bottom of the trench 404.

Figure 5D:
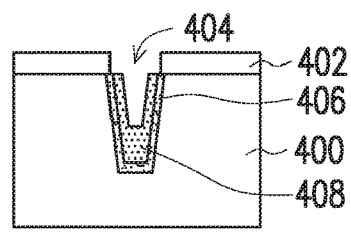
Figure 5E:
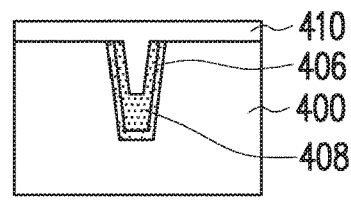

Referring to FIG. 5D, a portion of the nitride layer 408 on the pad oxide layer 402 is removed, and the portion of the nitride layer 408 within the trench 404 remains and partially fills the trench 404. Referring to FIG. 5E, an oxidation process is additionally performed to form the dielectric layer 410, which merges the pad oxide layer 402 as previously formed. The oxide layer 410 fills the trench 404.

Figure 5F:
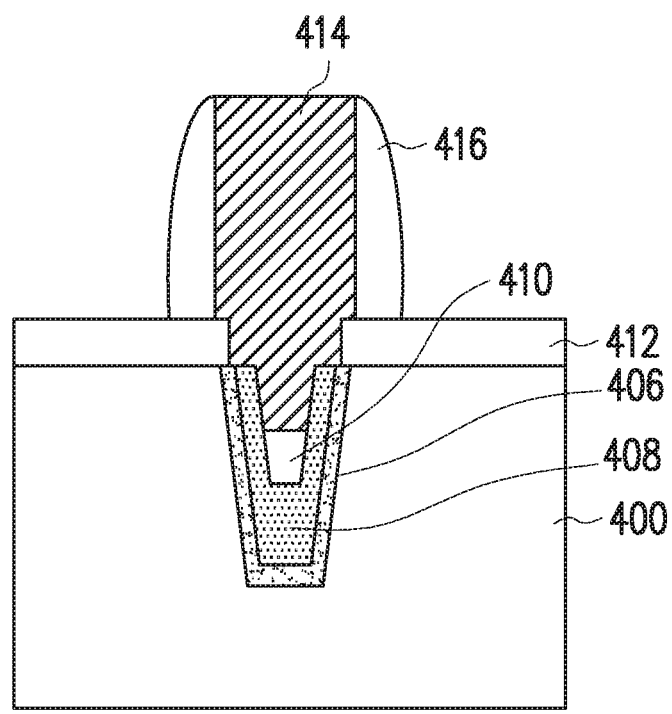

Referring to FIG. 5F, a portion of the oxide layer 410 corresponding to the trench 404 is removed, in which the residual portion of the oxide layer 410 forms the dielectric layer 412, disposed on the fin line substrate 400 other than the trench 404. The dielectric layer 410 has a residue portion on the nitride layer 408 at bottom of the trench 404. In accordance with the formation of the gate line 206, the gate-like structure 414 is disposed on the dielectric layer 412 and fully fills the trench 404. In addition, a spacer 416 can also be formed on the sidewall of the gate-like structure 414. The gate-like structure 414 and the dielectric structure within the trench 404 form the isolation structure 208 of the invention.

In an embodiment, as to the isolation structure, the gate-like structure 414 in an example includes polysilicon or a stack of high dielectric-constant (high-K) dielectric layer and metal layer, in which the high-K value is referring to a dielectric constant larger than the oxide material, such as nitride material. In an embodiment, the gate-like structure 414 is a bar line, crossing over the fin line substrate 400. In an embodiment, a width of the gate-like structure 414 is substantially equal to a width of a gate line for the fin field effect transistors.

In the embodiments of FIG. 5A to FIG. 5F, the trench 404 of the isolation structure 208 is formed in accordance with the trench process for the STI structure. However, the invention is not limited to the embodiments.

FIG. 6A to FIG. 6E are drawings, schematically illustrating a portion of the cross-section structure along the cutting line II-II in FIG. 2A in a process flow of the method to fabricate the isolation structure, according to an embodiment of the invention.

Figure 6A:
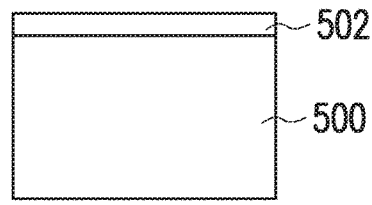
FIG. 6A to FIG. 6E are drawings, schematically illustrating a portion of the cross-section structure along the cutting line II-II in FIG. 2A in a process flow of the method to fabricate the isolation structure, according to an embodiment of the invention.

Referring to FIG. 6A, the isolation structure of the invention in another embodiment can be independently formed after the STI structure is formed. In this situation, the fin line substrate 500 and the pad oxide layer 502 is formed after the STI structure has been formed.

Figure 6B:
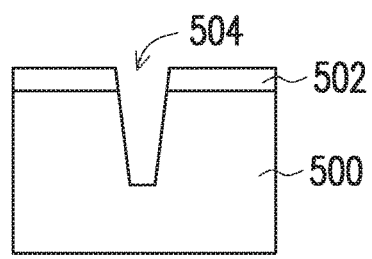

Referring to FIG. 6B, the trench 504 is formed in the fin line substrate 500 and crosses the fin line substrate 500. This trench 504 is formed after the STI structure has been formed.

Figure 6C:
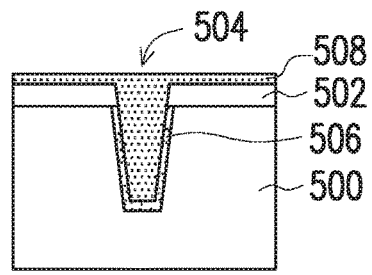
Figure 6D:
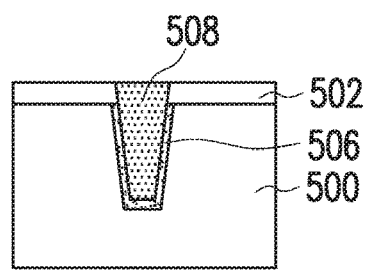

Referring to FIG. 6C, a liner layer 506 is formed on the indent surface of the trench 504. A nitride layer 508 is formed by a deposition process for the nitride material, so to form on the pad oxide layer 502 and fills into the trench 504. Referring to FIG. 6D, a portion of the nitride layer 508 on the pad oxide layer 502 is removed, and a portion of the nitride layer 508 within the trench 504 remains to fully fill the trench 504 in an example.

Figure 6E:
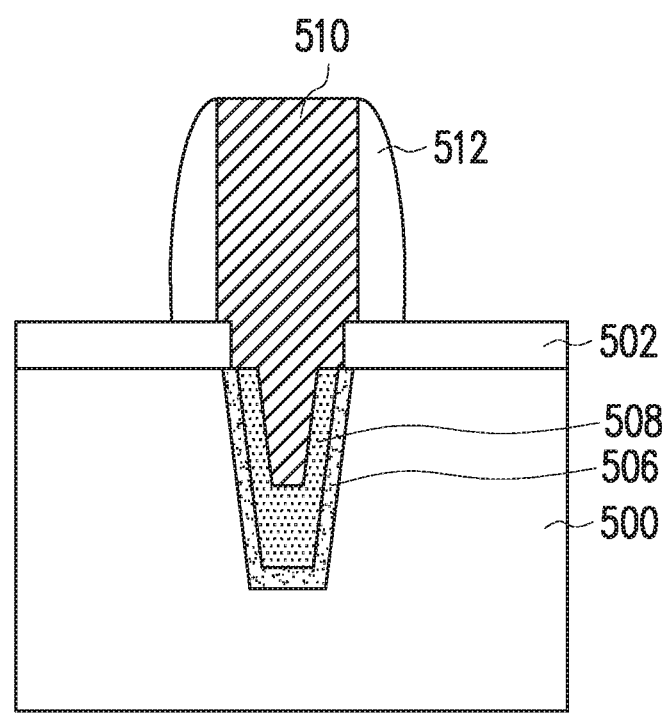

Referring to FIG. 6E, a central portion of the nitride layer 508 within the trench 504 is also removed and then a central portion of the trench 504 in the nitride layer 508 is again opened. Subsequently, the gate-like structure 510 is formed on the pad oxide layer 502 and fills the re-opening region of the trench 504. The spacer 512 may also be formed on sidewall of the gate-like structure 510, so to accomplish the fabrication of the isolation structure 208.

In general, combining the foregoing fabrication method, it can include forming a trench 404, 504 in a fin line substrate 400, 500. An oxide layer 412, 502 is formed on the fin line substrate 400, 500 other than the trench 404, 504. A liner layer 406, 506 is formed on an indent surface of the trench 404, 504. A nitride layer 408, 508 is formed on the liner layer 406, 506, partially filling the trench 404, 504. A gate-like structure 410, 510 is formed on the oxide layer 412, 502, and also fully filling the trench 404, 504.

The invention has provided the isolation structure to isolate the cell unit, in which the isolation structure has smaller width and can maintain the isolation effect in well condition. This is helpful to reduce the area in use for the memory apparatus.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An isolation structure, disposed between fin field effect transistors of a magnetic random access memory (MRAM) device, comprising:
    a fin line substrate having a trench crossing the fin line substrate;
    an oxide layer disposed on the fin line substrate other than the trench;
    a liner layer disposed on inclined and bottom surfaces of the trench;
    a nitride layer disposed on the liner layer, partially filling the trench wherein the nitride layer has equal height with a top surface of the liner layer, and the nitride layer at a central region has a depression;
    an oxide residue disposed on a bottom portion of the nitride layer within the trench; and
    a gate-like structure at least disposed on the oxide layer and the oxide residue and also fully filling the trench.

2. The isolation structure of claim 1, further comprising a spacer on a sidewall of the gate-like structure.

3. The isolation structure of claim 1, wherein the gate-like structure comprises polysilicon.

4. The isolation structure of claim 1, wherein the gate-like structure comprises a stack of high dielectric-constant dielectric layer and metal layer.

5. The isolation structure of claim 1, wherein the gate-like structure is a bar line crossing over the fin line substrate.

6. The isolation structure of claim 1, wherein a width of the gate-like structure is substantially equal to a width of a gate line for the fin field effect transistors.

7. The isolation structure of claim 1, wherein the trench is disposed between adjacent two cell units, and each cell unit comprises single bit cell.

8. An isolation structure, disposed between fin field effect transistors of a magnetic random access memory (MRAM) device, comprising:
   a fin line substrate having a trench crossing the fin line substrate;
   an oxide layer disposed on the fin line substrate other than the trench;
   a liner layer disposed on inclined and bottom surfaces of the trench;
   a nitride layer disposed on the liner layer, partially filling the trench wherein the nitride layer has equal height with a top surface of the liner layer and the nitride layer at a central region has a depression; and
   a gate-like structure disposed on the oxide layer, wherein a portion of the gate-like structure on the nitride layer to fully fill the trench.

9. The isolation structure of claim 8, further comprising a spacer on a sidewall of the gate-like structure.

10. The isolation structure of claim 8, wherein the gate-like structure comprises polysilicon.

11. The isolation structure of claim 8, wherein the gate-like structure comprises a stack of high dielectric-constant dielectric layer and metal layer.

12. The isolation structure of claim 8, wherein the gate-like structure is a bar line crossing over the fin line substrate.

13. The isolation structure of claim 8, wherein a width of the gate-like structure is substantially equal to a width of a gate line for the fin field effect transistors.

14. The isolation structure of claim 8, wherein the trench is disposed between adjacent two cell units, and each cell unit comprises single bit cell.

15. A method for fabricating isolation structure, disposed between fin field effect transistors of a magnetic random access memory (MRAM) device, comprising:
   forming a trench in a fin line substrate;
   forming an oxide layer on the fin line substrate other than the trench;
   forming a liner layer on inclined and bottom surfaces of the trench;
   forming a nitride layer on the liner layer, partially filling the trench wherein the nitride layer has equal height with a top surface of the liner layer and the nitride layer at a central region has a depression; and
   forming an oxide filling part on the nitride layer, partially filling the trench; and
   forming a gate-like structure on the oxide layer and the oxide filling part and also fully filling the trench.

16. The method of claim 15, wherein the trench is formed at same time for forming a trench of a shallow trench isolation (STI) structure of the MRAM device.

17. The method of claim 15, wherein the trench is formed after forming a shallow trench isolation (STI) structure of the MRAM device.

18. The method of claim 15, wherein the gate-like structure comprises polysilicon.

19. The method of claim 15, wherein the gate-like structure comprises a stack of high dielectric constant dielectric layer and metal layer.

20. The method of claim 15, wherein the gate-like structure is a bar line crossing over the fin line substrate, wherein a width of the gate-like structure is substantially equal to a width of a gate line for the fin field effect transistors.

* * * * *